United States Patent
Park et al.

(10) Patent No.: US 11,676,643 B2
(45) Date of Patent: Jun. 13, 2023

(54) MEMORY DEVICE, STORAGE DEVICE, AND METHOD OF OPERATING MEMORY CONTROLLER TO OUTPUT READ DATA IN RESPONSE TO READ ENABLE SIGNAL

(71) Applicant: SK hynix Inc., Gyeonggi-do (KR)

(72) Inventors: Ie Ryung Park, Gyeonggi-do (KR); Hyun Sub Kim, Gyeonggi-do (KR); Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 44 days.

(21) Appl. No.: 17/307,362

(22) Filed: May 4, 2021

(65) Prior Publication Data
US 2022/0148629 A1    May 12, 2022

(30) Foreign Application Priority Data
Nov. 10, 2020    (KR) .................. 10-2020-0149734

(51) Int. Cl.
*G11C 7/10*    (2006.01)
*G11C 5/14*    (2006.01)
*G11C 7/22*    (2006.01)

(52) U.S. Cl.
CPC .............. *G11C 7/1039* (2013.01); *G11C 5/14* (2013.01); *G11C 7/1045* (2013.01); *G11C 7/1063* (2013.01); *G11C 7/222* (2013.01)

(58) Field of Classification Search
CPC ..... G11C 7/1039; G11C 7/1045; G11C 7/222; G11C 7/1063; G11C 7/1057; G11C 5/14; G11C 2029/0411; G11C 16/26; G11C 16/08; G11C 16/10; G11C 16/32; G06F 3/0658
See application file for complete search history.

(56) References Cited

U.S. PATENT DOCUMENTS 5,768,215 A * 6/1998 Kwon .................. G11C 16/26
365/185.12

FOREIGN PATENT DOCUMENTS

| JP | 4166979 B2 * | 10/2008 | ............. G11C 16/08 |
| KR | 10-0546418 B1 | 1/2006 | |
| KR | 10-2020-0068629 A | 6/2020 | |

OTHER PUBLICATIONS

Machine translation of JP-4166979-B2; Oct. 2008; Choi Y; Japan (Year: 2008).*

* cited by examiner

*Primary Examiner* — Sultana Begum
(74) *Attorney, Agent, or Firm* — IP & T Group LLP

(57) ABSTRACT

The present technology relates to an electronic device. More specifically, the present technology relates to a memory device, a storage device, and a method of operating a memory controller. According to an embodiment, a memory device that outputs read data in response to a read enable signal provided from a memory controller includes a plurality of memory cells configured to store data, a plurality of page buffers configured to sense the data stored in the plurality of memory cells through a plurality of bit lines, and a data output controller configured to select a target page buffer to output data from among the plurality of page buffers according to a page buffer address control signal provided from the memory controller and control the selected target page buffer to output data stored in the selected target page buffer according to the read enable signal, while the read enable signal is input.

20 Claims, 10 Drawing Sheets

MEMORY DEVICE, STORAGE DEVICE, AND METHOD OF OPERATING MEMORY CONTROLLER TO OUTPUT READ DATA IN RESPONSE TO READ ENABLE SIGNAL

CROSS-REFERENCE TO RELATED APPLICATION

The present application claims priority under 35 U.S.C. § 119(a) to Korean patent application number 10-2020-0149734, filed on Nov. 10, 2020, which is incorporated herein by reference in its entirety.

BACKGROUND

Field of Invention

The present disclosure relates to an electronic device, and more particularly, to a memory device, a storage device, and a method of operating a memory controller.

Description of Related Art

A storage device is a device that stores data under control of a host device. The storage device may include a memory device storing data and a memory controller controlling the memory device. The memory device may be classified into a volatile memory device and a nonvolatile memory device.

The volatile memory device may store data only while receiving power from a power source. When the power supply is cut off, the data stored in the volatile memory device may be lost. The volatile memory device may include a static random access memory (SRAM), a dynamic random access memory (DRAM), and the like.

The nonvolatile memory device may be a device in which the data is not lost even though power of the power source is cut off. The nonvolatile memory device may include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device, a storage device, and a method of operating a memory controller of which performance of a read operation is improved.

According to an embodiment of the present disclosure, a memory device that outputs read data in response to a read enable signal provided from a memory controller may include a plurality of memory cells configured to store data, a plurality of page buffers configured to sense the data stored in the plurality of memory cells through a plurality of bit lines, and a data output controller configured to select a target page buffer to output data from among the plurality of page buffers according to a page buffer address control signal provided from the memory controller and control the selected target page buffer to output data stored in the selected target page buffer according to the read enable signal, while the read enable signal is input.

According to another embodiment of the present disclosure, a storage device may include a memory device including an input/output port, a read enable port, and a page buffer address port, and a memory controller configured to provide a read enable signal to the read enable port in response to a read request provided from a host, receive read data from the input/output port according to the read enable signal, temporarily store the read data received from the input/output port in a pre-allocated storage space, provide the page buffer address port with a page buffer address control signal for controlling an output of subsequent read data to be output next to the read data received from the input/output port according to whether an available storage capacity exists in the storage space, and provide the host with the read data temporarily stored in the storage space in response to completion of a read operation of the memory device.

According to still another embodiment of the present disclosure, a method of operating a memory controller that controls a memory device to perform a read operation may include providing a read enable signal indicating a timing at which the memory device outputs read data, to the memory device, receiving the read data sequentially outputted from the memory device according to the read enable signal, outputting a page buffer address control signal according to a result of monitoring whether an available storage capacity exists in a data buffer, and temporarily storing the read data sequentially received from the memory device in the data buffer during a period in which a voltage level of the page buffer address control signal is a first voltage level.

According to the present technology, a memory device, a storage device, and a method of operating a memory controller of which performance of a read operation is improved are provided.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and are not limited to the embodiments described in the present specification or application.

Figure 1:
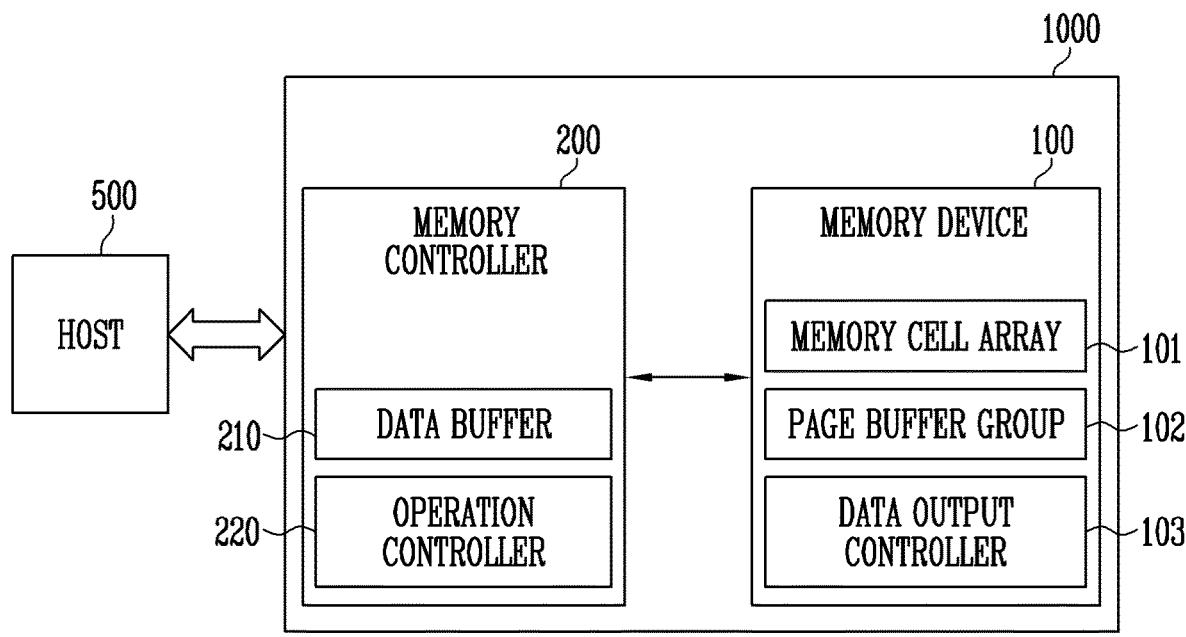
FIG. 1 is a diagram illustrating a storage system according to an embodiment of the present disclosure.

FIG. 1 is a diagram illustrating a storage system according to an embodiment of the present disclosure.

Referring to FIG. 1, the storage system may be implemented as a personal computer (PC), a data center, a corporate data storage system, a data processing system including a direct attached storage (DAS), a data processing system including a storage area network (SAN), and a data processing system including a network attached storage (NAS), or the like.

The storage system may include a storage device 1000 and a host 500.

The storage device 1000 may be a device that stores data according to a request of the host 500 such as a cellular phone, a smartphone, an MP3 player, a laptop computer, a desktop computer, a game player, a TV, a tablet PC, or an in-vehicle infotainment system.

The storage device 1000 may be manufactured as one of various types of storage devices according to a host interface that is a communication method with the host 500. For example, the storage device 1000 may be configured as any of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 1000 may be manufactured as any of various types of packages. For example, the storage device 1000 may be manufactured as any of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The storage device 1000 may include a memory device 100 and a memory controller 200.

The memory device 100 may operate in response to control of the memory controller 200. Specifically, the memory device 100 may receive a command and an address from the memory controller 200 and access a memory cell selected by the address among memory cells (not shown). The memory device 100 may perform an operation instructed by the command on the memory cell selected by the address.

The command may be, for example, a program command, a read command, or an erase command, and the operation instructed by the command may be, for example, a program operation (or a write operation), a read operation, or an erase operation.

The program operation may be an operation in which the memory device 100 stores data provided from the host 500 in response to control of the memory controller 200.

For example, the memory device 100 may receive the program command, an address, and data, and program the data in a memory cell selected by the address. Here, data to be programmed in the selected memory cell may be defined as write data. The write data may include data (or user data) provided from the host 500 and metadata of the data.

The read operation may be an operation in which the memory device 100 reads read data stored in the memory device 100 in response to the control of the memory controller 200.

For example, the memory device 100 may receive the read command and an address, and read data from a region selected by the address in the memory cell array (not shown). Data to be read from the selected region among data stored in the memory device 100 may be defined as the read data. The memory device 100 may provide the read data to the memory controller 200.

The erase operation may be an operation in which the memory device 100 erases the data stored in the memory device in response to the control of the memory controller 200.

For example, the memory device 100 may receive the erase command and an address, and erase data stored in a region selected by the address.

The memory device 100 may be implemented with a volatile memory device or a nonvolatile memory device.

For example, the volatile memory device may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM). The nonvolatile memory device may include a resistive random access memory (RRAM), a phase-change random access memory (PRAM), a magnetoresistive random access memory (MRAM), a ferroelectric random access memory, a spin transfer torque random access memory, and the like.

For example, the nonvolatile memory device may include a flash memory. For example, the flash memory may include a NAND flash memory, a vertical NAND flash memory (vertical NAND), a NOR flash memory, and the like.

In the present specification, for convenience of description, the memory device 100 is a NAND flash memory.

The memory device 100 may store the write data under the control of the memory controller 200, or read the stored data under the control of the memory controller 200 and provide the read data to the memory controller 200.

The memory device 100 may include a plurality of dies (not shown). One die may include at least one plane. One plane may include a memory cell array 101 including memory cells storing data.

The memory cell array 101 may include a plurality of memory blocks (not shown). The memory block may be a unit that performs an erase operation of erasing data.

The memory block may include a plurality of pages (not shown). The page may be a unit that performs the program operation of storing the write data or the read operation of reading the stored data.

The memory cell may be configured as any one of a single level cell (SLC) that stores one bit of data, a multi-level cell (MLC) that stores two bits of data, a triple-level cell (TLC) that stores three bits of data, and a quadruple level cell (QLC) that stores four bits of data. However, the present disclosure is not limited thereto, and the memory cell may store five or more bits of data.

The memory device 100 may include a page buffer group 102.

The page buffer group 102 may be a group including a plurality of page buffers. The page buffer group 102 may be electrically connected to the memory cell array 101. Each page buffer included in the page buffer group 102 may sense data stored in the memory cell array 101. Each page buffer included in the page buffer group 102 may temporarily store the sensed data.

The memory device 100 may include a data output controller 103.

The data output controller 103 may select a target page buffer to output the data from the page buffer group 102 under the control of the memory controller 200. The target page buffer may be a page buffer selected from among the plurality of page buffers. The data output controller 103 may control the target page buffer to provide data therefrom to the memory controller 200.

The memory controller 200 may control an overall operation of the storage device 1000.

When power is applied to the storage device 1000, the memory controller 200 may execute firmware. When the memory device 100 is a flash memory device, the firmware may include a host interface layer, a flash translation layer, and a flash interface layer. Here, the power may be, for example, power supplied from the outside.

The host interface layer may control an operation between the host 500 and the memory controller 200.

The flash translation layer may convert a logical address provided from the host 500 into a physical address.

The flash interface layer may control communication between the memory controller 200 and the memory device 100.

The memory controller 200 may control the memory device 100 to perform the program operation, the read operation, and the erase operation, respectively, in response to a write request, a read request, and an erase request of the host 500.

During the program operation, the memory controller 200 may provide the program command, the physical addresses, and the write data to the memory device 100.

During the read operation, the memory controller 200 may provide the read command and the physical address to the memory device 100. The memory controller 200 may receive the read data from the memory device 100.

Specifically, after the memory controller 200 provides the read command and the physical address to the memory device 100, the memory controller 200 may receive the read data from the memory device 100. The memory controller 200 may temporarily store the received read data in a pre-allocated storage space (not shown). In this case, an error may occur in the read data. The memory controller 200 may perform error correction decoding on the read data. An error bit of the read data may be corrected by the error correction decoding. At this time, a time for providing a response to the read request of the host 500 may be delayed (latency) according to the error correction decoding.

To this end, the memory controller 200 may control the memory device 100 to output subsequent read data according to whether an available storage capacity exists in a storage space. When the read operation of the memory device 100 is completed, the memory controller 200 may provide the read data temporarily stored in the storage space to the host 500 in response to the completion of the read operation.

In an embodiment, the memory controller 200 may include a data buffer 210 and an operation controller 220.

The data buffer 210 may temporarily store data. For example, the data buffer 210 may store data only while receiving power from an external power source. The data buffer 210 may have a storage space of a certain storage capacity.

For example, the data buffer 210 may be a buffer memory. For example, the data buffer 210 may be implemented as any of a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a resistive random access memory (RRAM), a phase-change random access memory (PRAM), a magnetoresistive random access memory (MRAM), a ferroelectric random access memory, and a spin transfer torque random access memory.

In an embodiment, when the storage capacity is full of data, the data buffer 210 may provide a flag signal (not shown) indicating that the storage space is insufficient to the operation controller 220.

The data buffer 210 shown in FIG. 1 may be included in the memory controller 200, but is not limited thereto, and the data buffer 210 shown in FIG. 1 may exist separately outside the memory controller 200.

The operation controller 220 may store the read data received from the memory device 100 in the data buffer 210.

In an embodiment, the operation controller 220 may monitor the storage capacity of the data buffer 210 regardless of the provision of the flag signal indicating that the storage space is insufficient from the data buffer 210 to the operation controller 220. Specifically, the operation controller 220 may monitor whether the available storage capacity exists in the storage capacity of the data buffer 210. The operation controller 220 may still store the read data received from the memory device 100 in the data buffer 210 having the available storage capacity. When the available storage capacity does not exist in the storage capacity of the data buffer 210, i.e., when the storage capacity of the data buffer 210 becomes full of the read data, the operation controller 220 may not store any more of the read data received from the memory device 100 in the data buffer 210 until the data buffer 210 secures again the available storage capacity.

In an embodiment, when the data buffer 210 provides the flag signal indicating that the storage space is insufficient to the operation controller 220, the operation controller 220 may monitor whether the available storage capacity exists in the storage capacity of the data buffer 210 according to whether the flag signal is received.

The operation controller 220 may control the memory device 100 to output the same read data that is already output or output subsequent read data according to a monitoring result.

For example, when the available storage capacity exists in the data buffer 210, the operation controller 220 may control the memory device 100 to output the subsequent read data. When the storage capacity of the data buffer 210 is insufficient, the operation controller 220 may control the memory device 100 to output the same read data that is already outputted.

The operation controller 220 may control the data buffer 210 to provide the read data temporarily stored in the storage space to the host 500 in response to the completion of the read operation of the memory device 100.

During the erase operation, the memory controller 200 may provide the erase command and the physical address to the memory device 100.

The memory controller 200 may generate the command, the addresses, and data autonomously regardless of a request provided from the host 500. The memory controller 200 may transmit the autonomously generated command, address, and data to the memory device 100.

For example, the memory controller 200 may generate a command, an address, and data for performing a background operation. In addition, the memory controller 200 may provide the command, the address, and the data to the memory device 100.

The background operation may be at least one of wear leveling, read reclaim, or garbage collection.

The wear leveling may mean, for example, static wear leveling, dynamic wear leveling, and the like. The static wear leveling may mean an operation of storing the number of times memory blocks are erased and moving cold data in which an erase operation or a write operation hardly occurs to a memory block having the largest number of erase times. The dynamic wear leveling may mean an operation of storing the number of times memory blocks are erased and programming data in a memory block having the least number of erase times.

The read reclaim may mean an operation of moving data stored in a memory block to another memory block before an uncorrectable error occurs in data stored in a memory block.

The garbage collection may mean an operation of copying valid data included in a bad block among memory blocks to a free block and erasing invalid data included in the bad block. Here, copying the valid data included in the bad block to the free block may mean moving the valid data included in the bad block to the free block.

The memory controller 200 may control two or more memory devices 100. In this case, the memory controller 200 may control the memory devices 100 according to an interleaving method to improve operation performance.

The interleaving method may be a method of controlling operations of two or more memory devices 100 to overlap.

The host 500 may communicate with the storage device 1000 through an interface (not shown).

The interface may be implemented with a serial advanced technology attachment (SATA) interface, a SATA express interface, a serial attached small computer system interface (SAS) interface, a peripheral component interconnect express (PCIe) interface, a nonvolatile memory express (NVMe) interface, an advanced host controller interface (AHCI), or a multimedia card interface. However, the interface is not limited thereto.

The host 500 may store data in the storage device 1000 or communicate with the storage device 1000 to obtain data stored in the storage device 1000.

In an embodiment, the host 500 may provide the storage device 1000 with a write request requesting to store data in the storage device 1000. In addition, the host 500 may provide the write request, data, and a logical address for identifying the data to the storage device 1000.

The storage device 1000 may store write data including the metadata and the data provided from the host 500 in the memory device 100 in response to the write request provided by the host 500, and provide a response that the storage is completed to the host 500.

In an embodiment, the host 500 may provide the storage device 1000 with a read request requesting to provide the host 500 with the data stored in the storage device 1000. In addition, the host 500 may provide the read request and a read address to the storage device 1000.

The storage device 1000 may read read data corresponding to the read address provided by the host 500 from the memory device 100 in response to the read request provided from the host 500, and provide the read data to the host 500 as a response to the read request.

Figure 2:
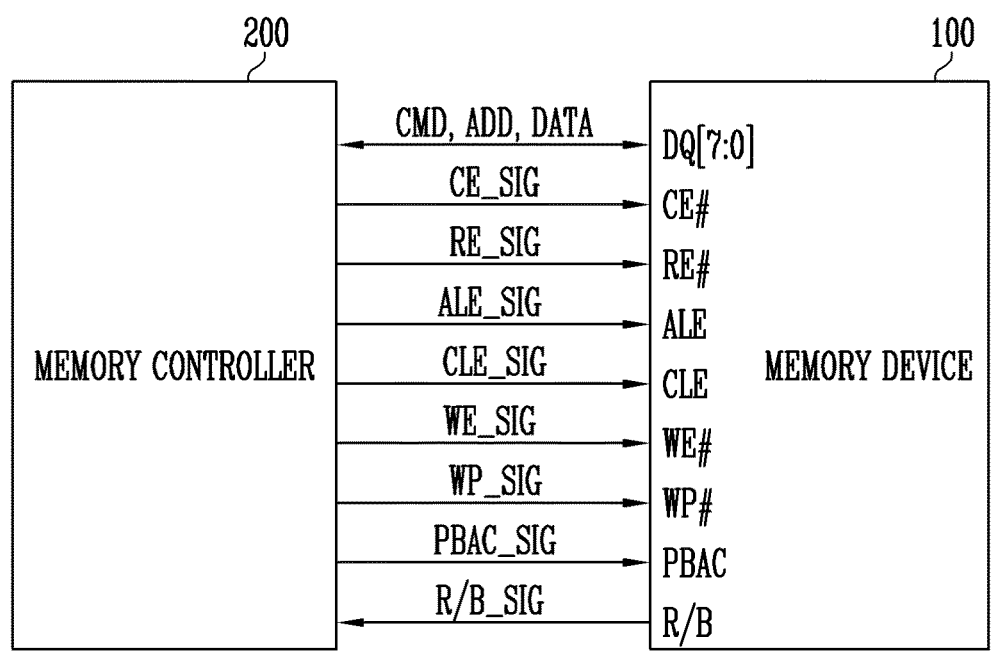
FIG. 2 is a diagram illustrating signals transmitted between a memory controller and a memory device according to an embodiment of the present disclosure.

FIG. 2 is a diagram illustrating signals transmitted between a memory controller and a memory device according to an embodiment of the present disclosure.

Referring to FIG. 2, the memory device 100 may include an input/output port DQ[7:0], a chip enable port CE #, a read enable port RE #, an address latch enable port ALE, a command latch enable port CLE, a write enable port WE #, a write protect port WP #, a page buffer address port PBAC, and a ready/busy port R/B.

The input/output port DQ[7:0] may be a port through which a command, an address, and data are transmitted. The input/output port DQ[7:0] may be an eight bits of bidirectional port, but is not limited thereto.

In an embodiment, the memory controller 200 may provide the command, the address, and the write data to the memory device 100 through the input/output port DQ[7:0].

In an embodiment, the memory device 100 may provide the read data to the memory controller 200 through the input/output port DQ[7:0].

The chip enable port CE # may be a port through which a chip enable signal CE_SIG is transmitted. The chip enable signal CE_SIG may be a signal for selecting a target memory device. Specifically, the chip enable signal CE_SIG may be a signal that activates or deactivates the memory device 100. For example, when a voltage level of the chip enable signal CE_SIG is a first voltage level, the memory device 100 may be activated, and when the voltage level of the chip enable signal CE_SIG is a second voltage level different from the first voltage level, the memory device 100 may be deactivated. Here, the deactivation of the memory device 100 may mean that the memory device 100 is in a ready state and the memory device 100 enters a low-power standby state. The activation of the memory device 100 may mean that the memory device 100 is in an operable state.

In an embodiment, the memory controller 200 may provide the chip enable signal CE_SIG to the memory device 100 through the chip enable port CE #.

In an embodiment, when the voltage level of the chip enable signal CE_SIG is the first voltage level (for example, a logic low level), the memory device 100 may be activated. When the voltage level of the chip enable signal CE_SIG is the second voltage level (for example, a logic high level), the memory device 100 may be deactivated.

The read enable port RE # may be a port through which a read enable signal RE_SIG is transmitted. The read enable signal RE_SIG may be a signal for outputting serial data. The read enable signal RE_SIG may be a clock signal toggling with constant pulse width and period. When a data transmission method is a double data rate (DDR) method, a DDR2 method, or a DDR3 method, serial data may be provided to the memory controller 200 in synchronization with a falling edge or a rising edge of the read enable signal RE_SIG.

In an embodiment, the memory controller 200 may provide the read enable signal RE_SIG to the memory device 100 through the read enable port RE # in response to the read request provided from the host 500.

In an embodiment, the memory device 100 may sequentially transmit the read data to the memory controller 200 through the input/output port DQ[7:0] in response to the falling edge or the rising edge of the read enable signal RE_SIG. The memory controller 200 may receive the read data from the input/output port DQ[7:0] according to the read enable signal RE_SIG.

The address latch enable port ALE may be a port through which an address latch enable signal ALE_SIG is transmitted. The address latch enable signal ALE_SIG may be a signal indicating that a signal transmitted through the input/output port DQ[7:0] is an address.

The command latch enable port CLE may be a port through which a command latch enable signal CLE_SIG is transmitted. The command latch enable signal CLE_SIG may be a signal indicating that a signal transmitted through the input/output port DQ[7:0] is a command.

In an embodiment, the memory controller 200 may provide the command latch enable signal CLE_SIG to the memory device 100 through the command latch enable port CLE.

The write enable port WE # may be a port through which a write enable signal WE_SIG is transmitted. The write enable signal WE_SIG may be a signal for controlling latching of the command, the address, and the data transmitted through the input/output port DQ[7:0].

In an embodiment, when a voltage level of each of the address latch enable signal ALE_SIG and the write enable signal WE_SIG is a first voltage level and a voltage level of each of the command latch enable signal CLE_SIG and the read enable signal RE_SIG is a second voltage level different from the first voltage level, the command may be provided to the memory controller 200 through the input/output port DQ[7:0].

In an embodiment, when the voltage level of each of the command latch enable signal CLE_SIG and the write enable signal WE_SIG is the first voltage level and the voltage level of each of the address latch enable signal ALE_SIG and the read enable signal RE_SIG is the second voltage level different from the first voltage level, the address may be provided to the memory controller 200 through the input/output port DQ[7:0].

In an embodiment, when the voltage level of each of the address latch enable signal ALE_SIG, the command latch enable signal CLE_SIG, and the write enable signal WE_SIG is the first voltage level and the voltage level of the read enable signal RE_SIG is the second voltage level different from the first voltage level, the read data may be provided to the memory controller 200 through the input/output port DQ[7:0].

In an embodiment, when the voltage level of each of the address latch enable signal ALE_SIG, the command latch enable signal CLE_SIG, and the read enable signal RE_SIG is the first voltage level and the voltage level of the write enable signal WE_SIG is the second voltage level different from the first voltage level, the write data may be provided to the memory device 100 through the input/output port DQ[7:0].

The write protect port WP # may be a port through which a write protect signal WP_SIG is transmitted. The write protect signal WP_SIG may be a signal for disabling the program operation and the erase operation.

The page buffer address port PBAC may be a port through which a page buffer address control signal PBAC_SIG is transmitted. The page buffer address control signal PBAC_SIG may be a signal for controlling the output of the subsequent read data to be output next to the read data received from the input/output port DQ[7:0] according to whether the available storage capacity exists in the storage space allocated to the memory controller 200. The page buffer address control signal PBAC_SIG may be a signal having the first voltage level or the second voltage level according to whether the available storage capacity exists in the storage space allocated to the memory controller 200. For example, the page buffer address control signal PBAC_SIG may be a signal having a logic low level or a logic high level according to whether the available storage capacity exists in the data buffer 210 included in the memory controller 200. Here, when the first voltage level is the logic low level, the second voltage level may be the logic high level. However, the present disclosure is not limited thereto.

In an embodiment, while the page buffer address control signal PBAC_SIG having the first voltage level is provided to the memory device 100 through the page buffer address port PBAC, the read data may be sequentially provided to the memory controller 200 through the input/output port DQ[7:0].

Specifically, the memory controller 200 may output the page buffer address control signal PBAC_SIG having the first voltage level when the available storage capacity exists. While the page buffer address control signal PBAC_SIG having the first voltage level is provided to the memory device 100, the memory controller 200 may receive the subsequent read data.

In an embodiment, while the page buffer address control signal PBAC_SIG having the second voltage level is provided to the memory device 100 through the page buffer address port PBAC, the same read data that is already provided may be again provided to the memory controller 200 through the input/output port DQ[7:0].

Specifically, when the storage capacity of the storage space is full, the memory controller 200 may output the page buffer address control signal PBAC_SIG having the second voltage level different from the first voltage level. While the page buffer address control signal PBAC_SIG having the second voltage level is provided to the memory device 100, previous read data may be received from the memory device 100. The previous read data may be read data output from the memory device 100 immediately before the storage capacity of the storage space is full.

The ready/busy port R/B may be a port through which a ready/busy signal R/B_SIG is transmitted. The ready/busy signal R/B_SIG may indicate a ready state or a busy state of the memory device 100. The ready state may be a state in which the memory device 100 may receive the command without performing an operation. The busy state may be a state in which the memory device 100 performs at least one operation.

According to the above-described embodiment, while the page buffer address control signal PBAC_SIG of the first voltage level is provided, the memory controller 200 may receive the subsequent read data, and while the page buffer address control signal PBAC_SIG of the second voltage level is provided, the memory controller 200 may receive the previous read data. However, the present disclosure is not limited thereto. According to a design method, while the page buffer address control signal PBAC_SIG of the second voltage level is provided, the memory controller 200 may receive the subsequent read data, and while the page buffer address control signal PBAC_SIG of the first voltage level is provided, the memory controller 200 may receive the previous read data.

In the present specification, a "port", a "pad", a "node", and the like may have the same meaning.

The memory device 100 may further include other ports in addition to the above-described ports DQ[7:0], CE #, RE #, ALE, CLE, WE #, WP #, PBAC, and RB.

Figure 3:
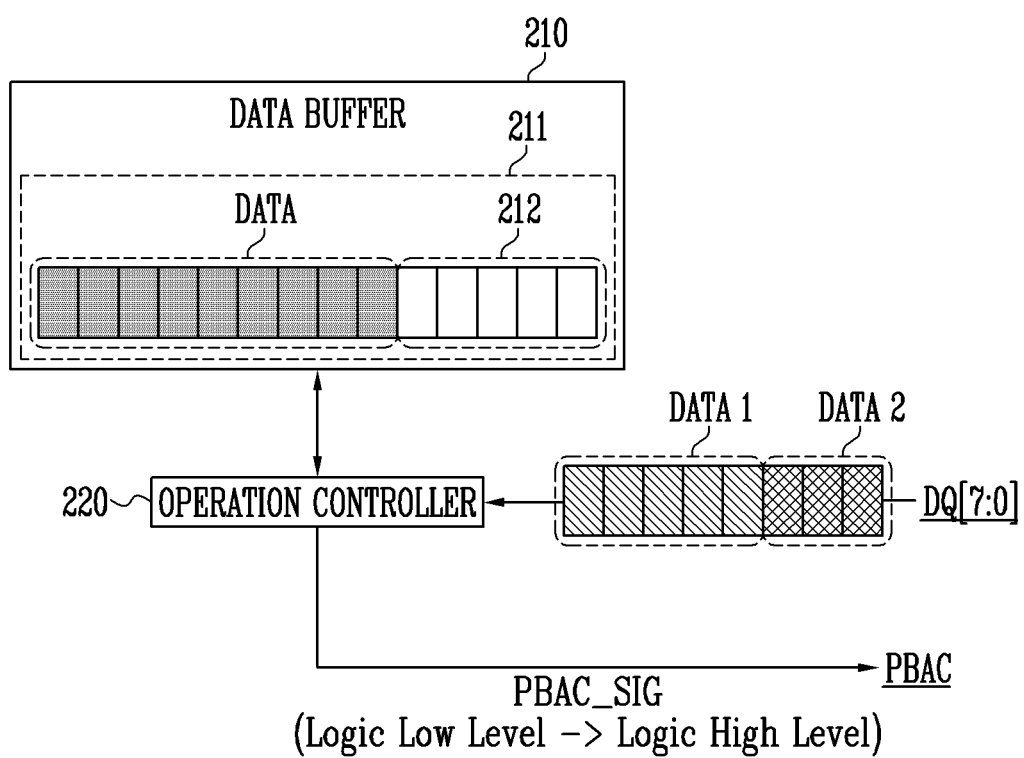
FIGS. 3 and 4 are diagrams illustrating a data buffer and an operation controller according to an embodiment of the present disclosure.
Figure 4:
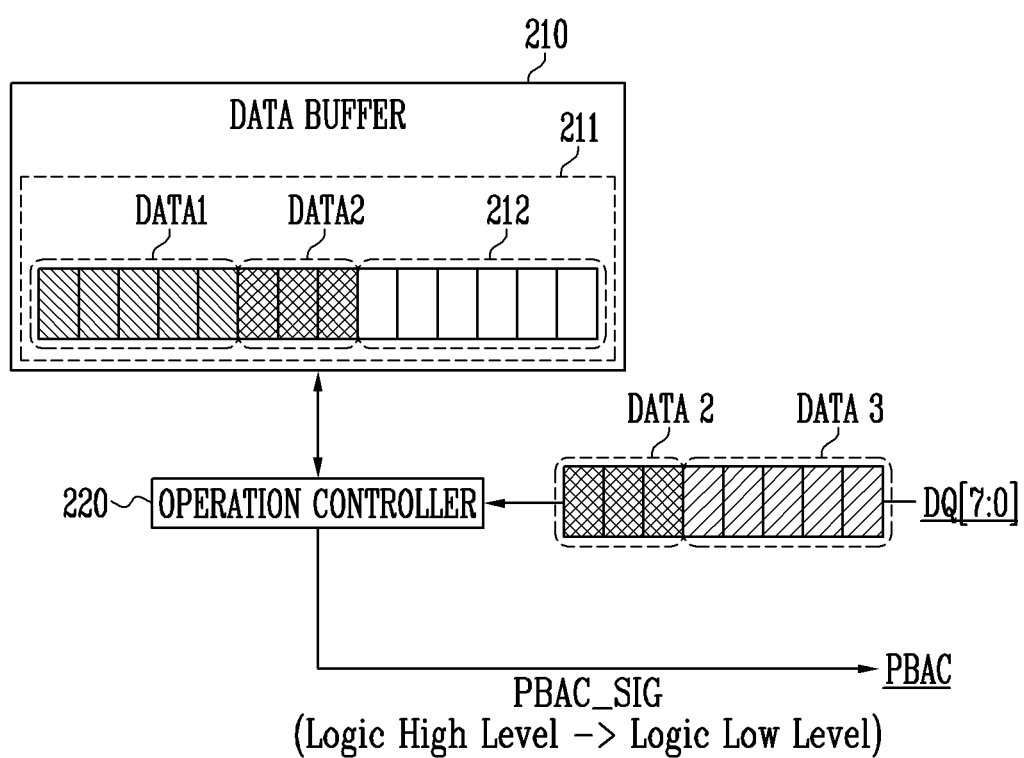

FIGS. 3 and 4 are diagrams illustrating a data buffer and an operation controller according to an embodiment of the present disclosure.

In describing the embodiments shown in FIGS. 3 and 4, the first to third data DATA 1, DATA 2, and DATA 3 are the read data to be provided in response to the read request of the current host 500, the first voltage level of the page buffer address control signal PBAC_SIG is the logic low level, and the second voltage level of the page buffer address control signal PBAC_SIG is the logic high level.

Referring to FIG. 3, the data buffer 210 may include a storage space 211. Data DATA may be stored in the storage space 211 of the data buffer 210. When the data DATA is stored in the storage space 211 provided in the data buffer 210, an available storage space 212 having an available storage capacity except for a size of the data DATA in the storage space 211 of the data buffer 210 may exist.

The operation controller 220 may monitor whether the available storage capacity exists in the storage capacity of the data buffer 210. In addition, the operation controller 220 may change the voltage level of the page buffer address control signal PBAC_SIG to the logic high level different from the logic low level according to a monitoring result.

Since the available storage space 212 exists, the operation controller 220 may provide the page buffer address control signal PBAC_SIG having the logic low level to the page buffer address port PBAC.

The first data DATA 1 may be provided to the operation controller 220 through the input/output port DQ[7:0]. The operation controller 220 may temporarily store the first data DATA 1 in the data buffer 210. As the first data DATA 1 is stored in the available storage space 212 of the data buffer 210, the storage capacity of the storage space 211 may be full. In this case, even though the second data DATA 2 to be output after the first data DATA 1 is provided to the operation controller 220 through the input/output port DQ[7:0], since the second data DATA 2 may not be stored in the data buffer 210, a time for providing a response to the read request may be delayed (latency).

When the storage capacity of the storage space 211 is full, the operation controller 220 may output the page buffer address control signal PBAC_SIG having the logic high level. That is, the voltage level of the page buffer address control signal PBAC_SIG may be changed from the logic low level to the logic high level.

While the page buffer address control signal PBAC_SIG having the logic high level is provided to the page buffer address port PBAC, the operation controller 220 may receive the previous read data from the input/output port DQ[7:0]. Here, the previous read data may be read data output from the input/output port DQ[7:0] before the voltage level of the page buffer address control signal PBAC_SIG is changed from the logic low level to the logic high level. Referring to FIG. 3, for example, the previous read data may be the first data DATA 1. The second data DATA 2 may not be output while the page buffer address control signal PBAC_SIG having the logic high level is provided to the page buffer address port PBAC.

Since the previous read data may be already stored in the storage space allocated to the memory controller 200, for example, the storage space 211 of the data buffer 210, the operation controller 220 may discard the previous read data received after the page buffer address control signal is provided to the memory device 100.

Referring to FIGS. 3 and 4, when the storage capacity of the storage space 211 is full, the operation controller 220 may perform a data buffer flush operation of flushing the data buffer 210 to generate the available storage capacity. Specifically, the operation controller 220 may provide the data buffer 210 with a command for instructing to flush the data DATA stored in the data buffer 210. The flushed data DATA may be deleted or provided to the host 500. However, the present disclosure is not limited thereto.

Referring to FIG. 4, after the data buffer flush operation is performed, the operation controller 220 may provide the page buffer address control signal PBAC_SIG having the logic low level to the page buffer address port PBAC. That is, the voltage level of the page buffer address control signal PBAC_SIG may be changed from the logic high level to the logic low level.

While the page buffer address control signal PBAC_SIG having the logic low level is provided to the page buffer address port PBAC, the operation controller 220 may receive the subsequent read data from the input/output port DQ[7:0]. Here, the subsequent read data may be, for example, the second data DATA 2 or the third data DATA 3 with reference to FIG. 4.

The operation controller 220 may temporarily store the subsequent read data in the data buffer 210.

Figure 5:
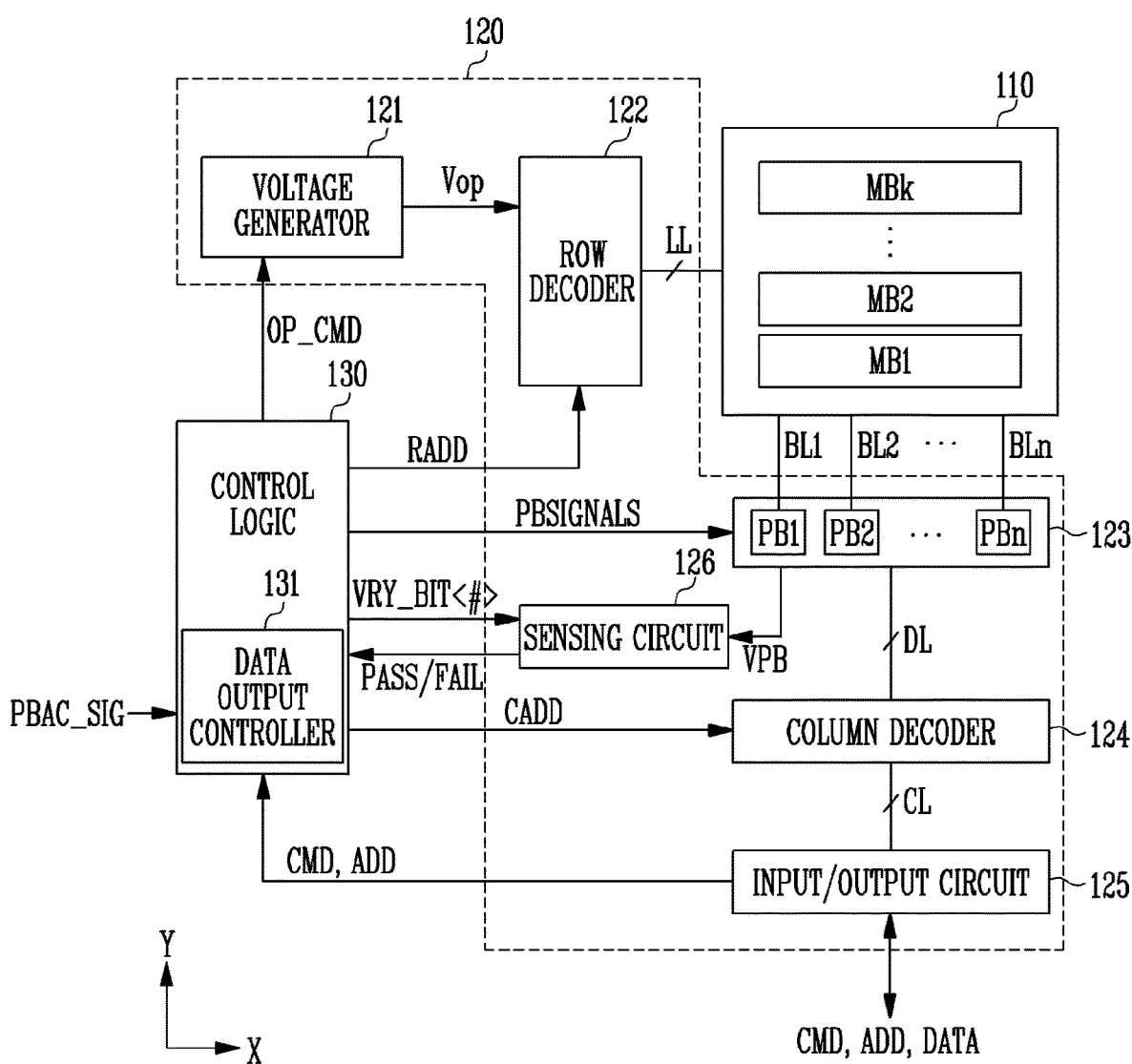
FIG. 5 is a diagram illustrating a memory device according to an embodiment of the present disclosure.

FIG. 5 is a diagram illustrating a memory device according to an embodiment of the present disclosure.

Referring to FIG. 5, the memory device 100 may include a memory cell array 110, a peripheral circuit 120, and a control logic 130.

The memory cell array 110 may perform the same function as the memory cell array 101 described with reference to FIG. 1.

The memory cell array 110 may include a plurality of memory blocks MB1 to MBk (k is a positive integer). Here, the number of the plurality of memory blocks MB1 to MBk is only an example for describing embodiments of the present disclosure, but is not limited thereto.

Each of the memory blocks MB1 to MBk may be connected to local lines LL and bit lines BL1 to BLn (n is a positive integer).

The local lines LL may be connected to a row decoder 122.

The local lines LL may be connected to each of the memory blocks MB1 to MBk.

Although not shown, the local lines LL may include a first select line, a second select line, and a plurality of word lines arranged between the first select line and the second select lines.

Although not shown, the local lines LL may further include dummy lines arranged between the first select line and the word lines, dummy lines arranged between the second select line and the word lines, and pipelines.

The bit lines BL1 to BLn may be commonly connected to the memory blocks MB1 to MBk.

The memory blocks MB1 to MBk may be implemented as a two-dimensional or three-dimensional structure.

For example, in the memory blocks MB1 to MBk of the two-dimensional structure, memory cells may be arranged in a direction parallel to a substrate.

For example, in the memory blocks MB1 to MBk of the three-dimensional structure, memory cells may be stacked on a substrate in a vertical direction.

The peripheral circuit 120 may include a voltage generator 121, the row decoder 122, a page buffer group 123, a column decoder 124, an input/output circuit 125, and a sensing circuit 126.

The voltage generator 121 may generate various operation voltages Vop used for the program operation, the read operation, and the erase operation in response to an operation command OP_CMD. In addition, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, and the like under control of the control logic 130.

In an embodiment, the voltage generator 121 may generate an internal power voltage by regulating an external power voltage. The internal power voltage generated by the voltage generator 121 is used as an operation voltage of the memory device 100.

In an embodiment, the voltage generator 121 may generate a plurality of voltages using an external power voltage or an internal power voltage. For example, the voltage generator 121 may include a plurality of pumping capacitors that receive the internal power voltage, and generate a plurality of voltages by selectively activating the plurality of pumping capacitors in response to the control of the control logic 130. The generated voltages may be supplied to the memory cell array 110 by the row decoder 122.

The row decoder 122 may transfer the operation voltages Vop to the local lines LL in response to a row address RADD. The operation voltages Vop may be transferred to selected memory blocks MB1 to MBk through the local lines LL.

For example, during the program operation, the row decoder 122 may apply the program voltage to a selected word line and a program pass voltage of a level less than that of the program voltage to unselected word lines. During the program verify operation, the row decoder 122 may apply the verify voltage to the selected word line and a verify pass voltage higher than the verify voltage to the unselected word lines.

During the read operation, the row decoder 122 may apply the read voltage to the selected word line, and apply a read pass voltage higher than the read voltage to the unselected word lines.

During the erase operation, the row decoder 122 may select one memory block according to a decoded address. During the erase operation, the row decoder 122 may apply a ground voltage to word lines connected to the selected memory block.

The page buffer group 123 may perform the same function as the page buffer group 102 described with reference to FIG. 1.

The page buffer group 123 may include first to n-th page buffers PB1 to PBn. The first to n-th page buffers PB1 to PBn may be connected to the memory cell array 110 through the first to n-th bit lines BL1 to BLn, respectively. The first to n-th page buffers PB1 to PBn may operate in response to the control of the control logic 130.

Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read operation or the verify operation.

During the program operation, when the program voltage is applied to the selected word line, the first to n-th page buffers PB1 to PBn may transfer data DATA received through the column decoder 124 and the input/output circuit 125 to the selected memory cells through the first to n-th bit lines BL1 to BLn. The memory cells of the selected page are programmed according to the transferred data DATA. The memory cell connected to the bit line to which a program permission voltage (for example, a ground voltage) is applied may have an increased threshold voltage. The threshold voltage of the memory cell connected to the bit line to which a program inhibit voltage (for example, a power voltage) is applied may be maintained.

During the verify operation, the first to n-th page buffers PB1 to PBn may sense the data stored in the selected memory cells from the selected memory cells through the first to n-th bit lines BL1 to BLn.

During the read operation, the first to n-th page buffers PB1 to PBn may sense the data DATA from the memory cells of the selected page through the first to n-th bit lines BL1 to BLn, and output the sensed data DATA to the input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADD received from the memory controller 200 to the control logic 130, or may exchange data DATA with the column decoder 124.

During the read operation or the verify operation, the sensing circuit 126 may generate a reference current in response to a permission bit signal VRY_BIT<#> and compare a sensing voltage VPB received from the page buffer group 123 with a reference voltage generated by the reference current to output a pass signal PASS or a fail signal FAIL.

The control logic 130 may output the operation command OP_CMD, the row address RADD, the page buffer control signals PBSIGNALS, and the permission bit VRY_BIT<#> in response to the command CMD and the address ADD to control the peripheral circuit 120.

In an embodiment, the control logic 130 may include a data output controller 131.

The data output controller 131 may perform the same function as the data output controller 103 described with reference to FIG. 1.

While the read enable signal RE_SIG is input, the data output controller 131 may select a target page buffer to output the data from the first to n-th page buffers PB1 to PBn according to the page buffer address control signal PBAC_SIG.

In an embodiment, during a period in which the voltage level of the page buffer address control signal PBAC_SIG is the first voltage level, the data output controller 131 may sequentially select the target page buffer according to the address of the page buffer. For example, during a period in which the voltage level of the page buffer address control signal PBAC_SIG is the logic low level, the data output controller 131 may select the target page buffer sequentially from the first page buffer PB1 to the n-th page buffer PBn. As another example, during the period in which the voltage level of the page buffer address control signal PBAC_SIG is the logic low level, the data output controller 131 may select the target page buffer sequentially from the n-th page buffer PBn to the first page buffer PB1.

In an embodiment, during a period in which the voltage level of the page buffer address control signal PBAC_SIG is the second voltage level different from the first voltage level, the data output controller 131 may maintain the target page buffer. For example, during a period in which the voltage level of the page buffer address control signal PBAC_SIG is the logic high level, the data output controller 131 may select one of the first to n-th page buffers PB1 to PBn as the target page buffer and maintain the target page buffer. The target page buffer selected during the period in which the voltage level of the page buffer address control signal PBAC_SIG is the logic high level, may be, for example, the page buffer selected before the voltage level of the page buffer address control signal PBAC_SIG is changed from the logic low level to the logic high level.

The data output controller 131 may control the selected target page buffer to output data stored in the selected target page buffer according to the read enable signal RE_SIG.

In an embodiment, when the data transmission method is a DDR method, a DDR2 method, or a DDR3 method, the data output controller 131 may output the data stored in the selected target page buffer to the input/output circuit 125 in synchronization with a falling edge or a rising edge of the read enable signal RE_SIG.

Figure 6:
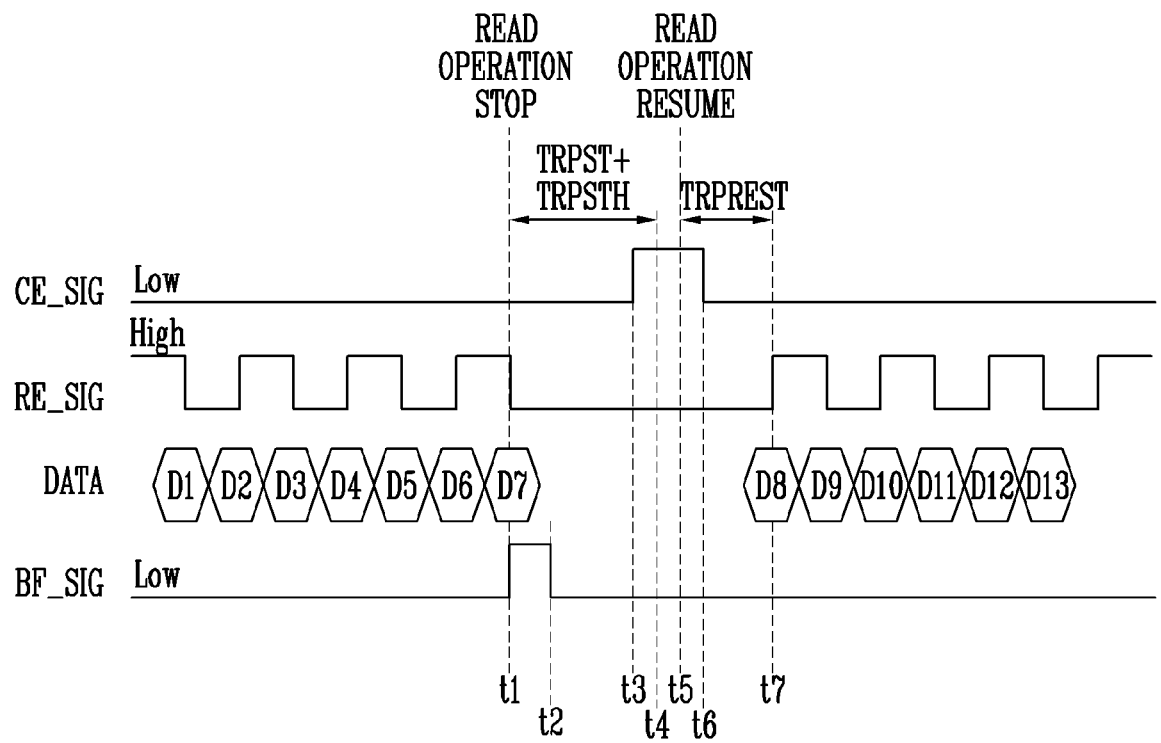
FIG. 6 is a waveform diagram illustrating a chip enable signal, a read enable signal, and data according to a comparative example.
Figure 7:
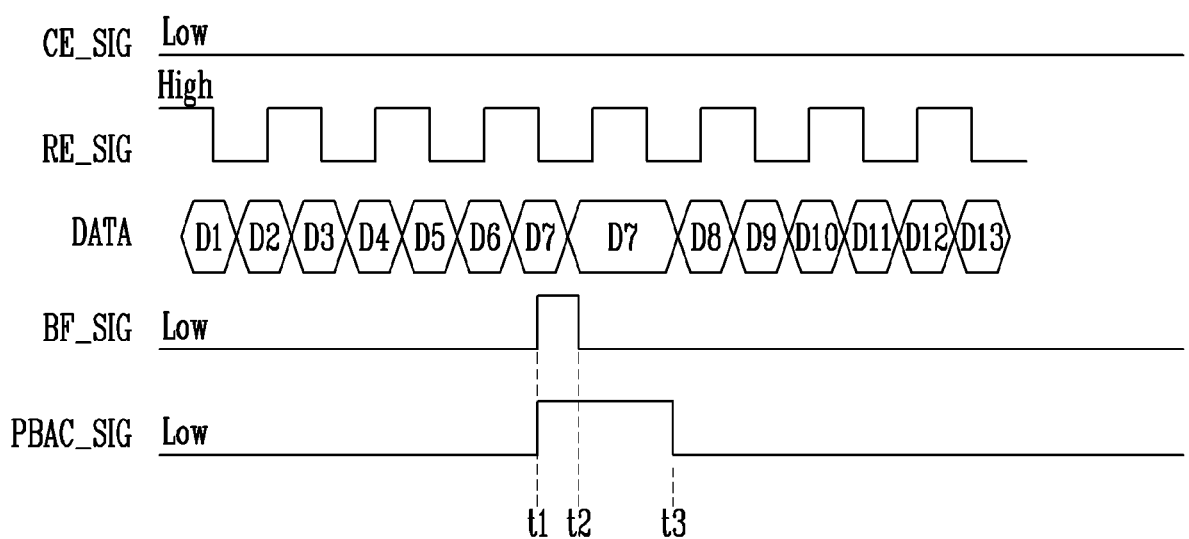
FIG. 7 is a waveform diagram illustrating a chip enable signal, a read enable signal, and data according to an embodiment of the present disclosure.

FIG. 6 is a waveform diagram illustrating a chip enable signal, a read enable signal, and data according to a comparative example, and FIG. 7 is a waveform diagram illustrating a chip enable signal, a read enable signal, and data according to an embodiment of the present disclosure.

The waveform diagram according to the comparative example shown in FIG. 6 is a diagram illustrating a notification signal BF_SIG, a chip enable signal CE_SIG, a read enable signal RE_SIG, and data DATA output from a memory device when a storage capacity of a storage space allocated to a memory controller according to the comparative example is full, in a case where a memory device does not include a page buffer address port PBAC.

The waveform diagram according to the present embodiment shown in FIG. 7 is a diagram illustrating a notification signal BF_SIG, a chip enable signal CE_SIG, a read enable signal RE_SIG, a page buffer address control signal PBAC_SIG, and data DATA output from the memory device 100 when the storage capacity of the storage space allocated to the memory controller is full, in a case where the memory device 100 includes the page buffer address port PBAC.

In describing the comparative example shown in FIG. 6 and the embodiment of the present disclosure shown in FIG. 7, a logic low level Low is a first voltage level, a logic high level High is a second voltage level, and the data transmission method is a DDR method, a DDR2 method, or a DDR3 method.

Referring to FIG. 6, until a first time point t1, a voltage level of the chip enable signal CE_SIG may be the logic low level Low. In addition, when an available storage capacity exists in the storage space allocated to the memory controller according to the comparative example, a voltage level of the notification signal BF_SIG may be the logic low level Low. Here, the notification signal BF_SIG may be generated inside the memory controller according to the comparative example. The read enable signal RE_SIG may be toggled as a clock signal having the logic high level High or the logic low level Low.

Until the first time point t1, the data DATA may be output in synchronization with a falling edge or a rising edge of the read enable signal RE_SIG. For example, first read data D1 may be output in synchronization with the falling edge of the read enable signal RE_SIG. Second read data D2 may be output in synchronization with the rising edge of the read enable signal RE_SIG. In such a method, third to seventh read data D3, D4, D5, D6, and D7 may be sequentially output in synchronization with the falling edge or the rising edge of the read enable signal RE_SIG.

At the first time point t1, when the storage capacity of the storage space allocated to the memory controller according to the comparative example is full, the voltage level of the notification signal BF_SIG may be the logic high level High. In this case, a read operation of the memory device according to the comparative example may be stopped. This may be the same as a state in which the read operation is ended. At this time, a read postamble time TRPST, which is a delay time essentially accompanied after the read operation is ended, and a read postamble hold time TRPSTH, which is additionally generated, may occur. A sum of the read postamble time TRPST and the read postamble hold time TRPSTH may be a period corresponding from the first time point t1 to a fourth time point t4. The voltage level of the chip enable signal CE_SIG may be changed from the logic low level Low to the logic high level High after the first time point t1 according to the read postamble time TRPST and the read postamble hold time TRPSTH.

The read enable signal RE_SIG may not be toggled from the first time point t1. That is, the voltage level of the read enable signal RE_SIG may be the logic low level Low. Since the read enable signal RE_SIG is not toggled, the data DATA may not be output from the first time point t1.

At a second time point t2, when the available storage capacity exists in the storage space allocated to the memory controller according to the comparative example, the voltage level of the notification signal BF_SIG may be the logic low level Low.

At a third time point t3, the voltage level of the chip enable signal CE_SIG may be changed from the logic low level Low to the logic high level High.

At a fifth time point t5, the read operation may be resumed. A read preamble time TRPREST, which is a delay time essentially accompanied after the read operation is started, may occur. The read preamble time TRPREST may be a period from the fifth time point t5 to a seventh time point t7. The voltage level of the chip enable signal CE_SIG may be changed from the logic high level High to the logic low level Low after the fifth time point t5 according to the read preamble time TRPREST.

At a sixth time point t6, the voltage level of the chip enable signal CE_SIG may be changed from the logic high level High to the logic low level Low.

The read enable signal RE_SIG may be toggled again from the seventh time point t7. In this case, the data DATA may be output successively to data (for example, the read data D7) of which the output is stopped, in synchronization with the falling edge or the rising edge of the read enable signal RE_SIG. For example, eighth read data D8 may be output in synchronization with the rising edge of the read enable signal RE_SIG. Ninth read data D9 may be output in synchronization with the falling edge of the read enable signal RE_SIG. In such a method, tenth to thirteenth read data D10, D11, D12, and D13 may be output in synchronization with the falling edge or the rising edge of the read enable signal RE_SIG.

As described above with reference to FIG. 6, when the memory device does not include the page buffer address port PBAC, latency may occur as the read operation is stopped due to the read postamble time TRPST, the read postamble hold time TRPSTH, and the read preamble time TRPREST. Therefore, read operation performance of the storage device according to the comparative example may be reduced due to the latency.

On the other hand, according to an embodiment of the present disclosure, since the data DATA is sequentially output or the output data DATA is not changed and is maintained by the page buffer address control signal PBAC_SIG, the read operation may not be stopped. Accordingly, latency due to stop of the read operation may be greatly reduced or may not occur.

Referring to FIG. 7, until a first time point t1, the voltage level of the chip enable signal CE_SIG may be the logic low level Low. When the available storage capacity exists in the storage space allocated to the memory controller 200 according to an embodiment of the present disclosure, the voltage level of the notification signal BF_SIG may be the logic low level Low. The storage space allocated to the memory controller 200 may be, for example, the storage space of the data buffer 210. Meanwhile, the read enable signal RE_SIG may be toggled.

Until the first time point t1, the voltage level of the page buffer address control signal PBAC_SIG may be the logic low level Low. In this case, the first to seventh read data D1, D2, D3, D4, D5, D6, and D7 may be sequentially output in synchronization with the falling edge or the rising edge of the read enable signal RE_SIG.

Referring to FIGS. 1, 2, and 7, for example, when the available storage capacity exists, the memory controller 200 may output the page buffer address control signal PBAC_SIG having the logic low level Low to the memory device 100. The memory device 100 may sequentially provide the first to seventh read data D1, D2, D3, D4, D5, D6, and D7 to the memory controller 200 through the input/output port DQ[7:0] in response to the falling edge or the rising edge of the read enable signal RE_SIG provided by the memory controller 200. The memory controller 200 may sequentially receive the first to seventh read data D1, D2, D3, D4, D5, D6, and D7 from the input/output port DQ[7:0]. In addition, the memory controller 200 may temporarily store the sequentially received first to seventh read data D1, D2, D3, D4, D5, D6, and D7.

Referring to FIGS. 3, 4, 5, and 7, specifically, for example, during a period until the first time point t1, the data output controller 131 may select the first to n-th page buffers PB1 to PBn in an ascending order of the address of the page buffer as the target page buffer. At this time, when the first page buffer PB1 to the seventh page buffer (not shown) respectively output the first to seventh read data D1, D2, D3, D4, D5, D6, and D7, the data output controller 131 may sequentially select the first page buffer PB1 to the seventh page buffer (not shown) as the target page buffer. The data output controller 131 may control the selected target page buffer to output the first to seventh read data D1, D2, D3, D4, D5, D6, and D7 according to the falling edge or the rising edge of the read enable signal RE_SIG. The operation controller 220 may sequentially receive the first to seventh read data D1, D2, D3, D4, D5, D6, and D7, and store the first to seventh read data D1, D2, D3, D4, D5, D6, and D7 in the data buffer 210.

At the first time point t1, when the storage capacity of the storage space allocated to the memory controller 200 according to an embodiment of the present disclosure is full, the voltage level of the notification signal BF_SIG may be the logic high level High. In this case, the voltage level of the page buffer address control signal PBAC_SIG may be changed from the logic low level Low to the logic high level High. In this case, the seventh read data D7, which is the read data output before the voltage level of the page buffer address control signal PBAC_SIG is changed from the logic low level Low to the logic high level High, may be output in synchronization with the falling edge or the rising edge of the read enable signal RE_SIG.

Referring to FIGS. 1, 2, and 7, for example, when the storage capacity of the storage space is full, the memory controller 200 may output the page buffer address control signal PBAC_SIG having the logic high level High to the memory device 100. In response to the falling edge or the rising edge of the read enable signal RE_SIG provided by the memory controller 200, the memory device 100 may provide the seventh read data D7, which is the previous read data, to the memory controller 200 through the input/output port DQ[7:0]. The memory controller 200 may receive the seventh read data D7 from the input/output port DQ[7:0]. The memory controller 200 may discard the seventh read data D7 that is received after the first time point t1.

Referring to FIGS. 3, 4, 5, and 7, specifically, for example, when the seventh page buffer outputs the seventh read data D7, the seventh page buffer that outputs the seventh read data D7 before the page buffer address control signal PBAC_SIG is changed from the logic low level Low to the logic high level High may be maintained as the target page buffer. The data output controller 131 may maintain the seventh page buffer as the target page buffer during a period from the first time point t1 to a third time point t3. The operation controller 220 may receive the seventh read data D7.

At a second time point t2, when the available storage capacity exists in the storage space allocated to the memory controller 200 according to an embodiment of the present disclosure, the voltage level of the notification signal BF_SIG may be the logic low level Low.

At the third time point t3, the page buffer address control signal PBAC_SIG may be changed from the logic high level High to the logic low level Low. Eighth to thirteenth read data D8, D9, D10, D11, D12, and D13 may be sequentially output in response to the falling edge or the rising edge of the read enable signal RE_SIG.

Referring to FIGS. 3, 4, 5, and 7, specifically, for example, after the third time point t3, the operation controller 220 may sequentially receive the eighth to thirteenth read data D8, D9, D10, D11, D12, and D13. In addition, the operation controller 220 may store the eighth to thirteenth read data D8, D9, D10, D11, D12, and D13 in the data buffer 210.

The read enable signal RE_SIG shown in FIG. 7 may be toggled while the page buffer address control signal PBAC_SIG is provided.

As described above, since the read operation is maintained by the page buffer address control signal PBAC_SIG, there is an effect that latency due to stop of the read operation is greatly reduced.

Figure 8:
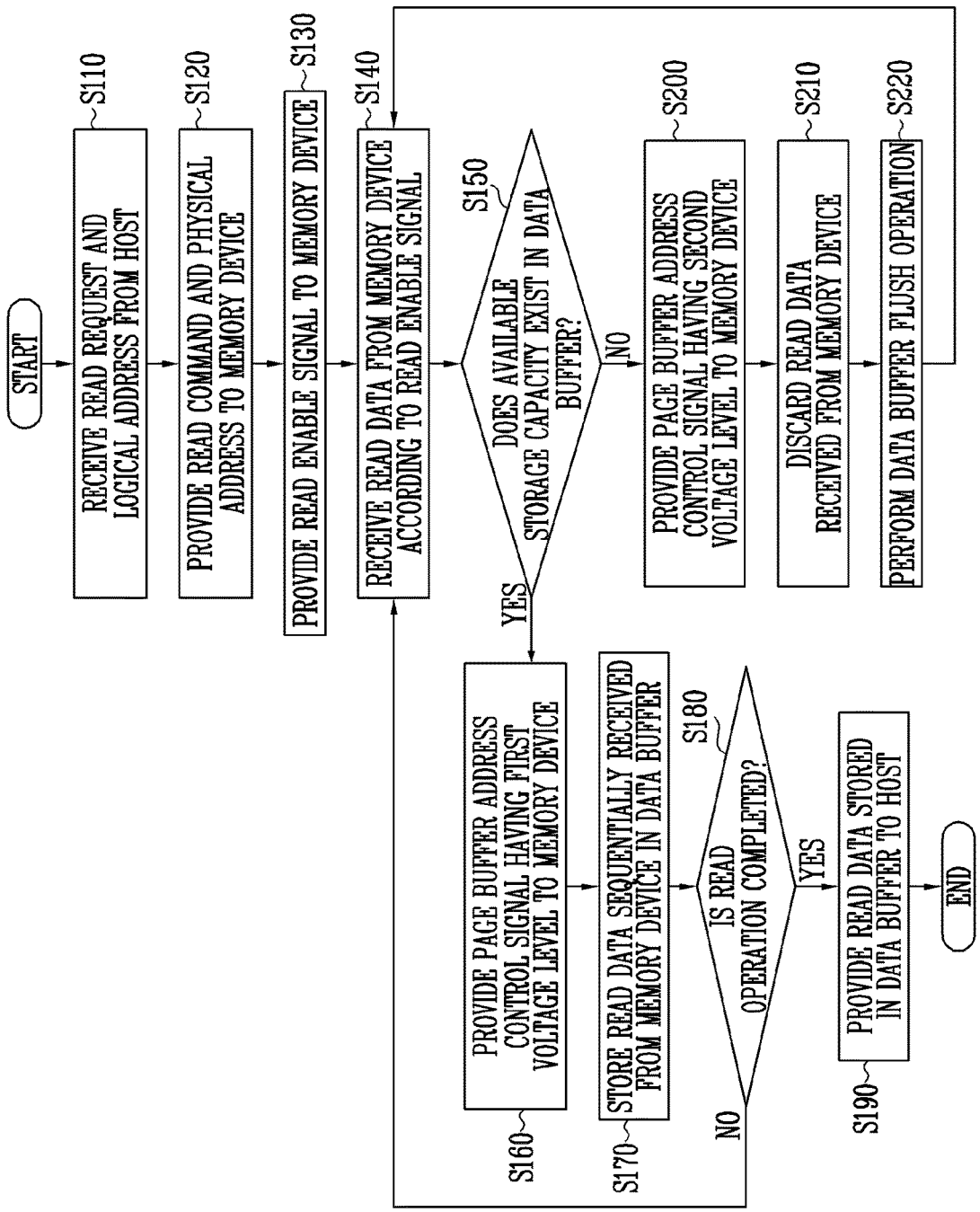
FIG. 8 is a flowchart illustrating a method of operating a memory controller according to an embodiment of the present disclosure.

FIG. 8 is a flowchart illustrating a method of operating a memory controller according to an embodiment of the present disclosure.

Referring to FIGS. 1, 2, and 8, the memory controller 200 receives the read request and the logical address from the host 500 (S110).

The memory controller 200 generates the read command in response to the read request from the host 500, generates the physical address corresponding to the logical address provided from the host 500, and provides the read command and the physical address to the memory device 100 (S120).

The memory controller 200 provides the read enable signal to the memory device 100 (S130). Here, the read enable signal RE_SIG may be a signal indicating a timing at which the memory device 100 outputs the read data.

The memory controller 200 receives the read data sequentially output from the memory device 100 according to the read enable signal RE_SIG (S140). In this case, the read data and the subsequent read data may be sequentially output. Alternatively, the same read data that is previously provided may be output.

The memory controller 200 monitors whether the available storage capacity exists in the data buffer 210 (S150).

When the available storage capacity exists in the data buffer 210 (S150, Yes), the memory controller 200 provides the page buffer address control signal PBAC_SIG having the first voltage level to the memory device 100 (S160). The page buffer address control signal PBAC_SIG having the first voltage level may be a signal instructing to sequentially output the read data.

The memory controller 200 may store the read data sequentially received from the memory device 100 in the data buffer 210 (S170).

The memory controller 200 checks whether the read operation of the memory device 100 is completed (S180).

When the read operation is completed (S180, Yes), the memory controller 200 provides the read data stored in the data buffer 210 to the host 500 (S190).

When the read operation is not completed (S180, No), step S140 is performed.

When the storage capacity of the data buffer 210 is full (S150, No), the memory controller 200 provides the page buffer address control signal PBAC_SIG having the second voltage level to the memory device 100 (S200). The page buffer address control signal PBAC_SIG having the second voltage level may be a signal instructing to output the same read data or the previous read data. The previous read data may be the read data output from the memory device 100 before the voltage level of the page buffer address control signal PBAC_SIG is changed from the first voltage level (for example, the logic low level) to the second voltage level (for example, the logic high level).

The memory controller 200 discards the read data received from the memory device 100 while providing the page buffer address control signal PBAC_SIG having the second voltage level to the memory device 100 (S210).

The memory controller 200 performs the data buffer flush operation (S220), and operation S140 is performed. The data buffer flush operation may be an operation in which the memory controller 200 flushes the data buffer 210 to generate the available storage capacity. Then the process may be fed back to operation S140.

Figure 9:
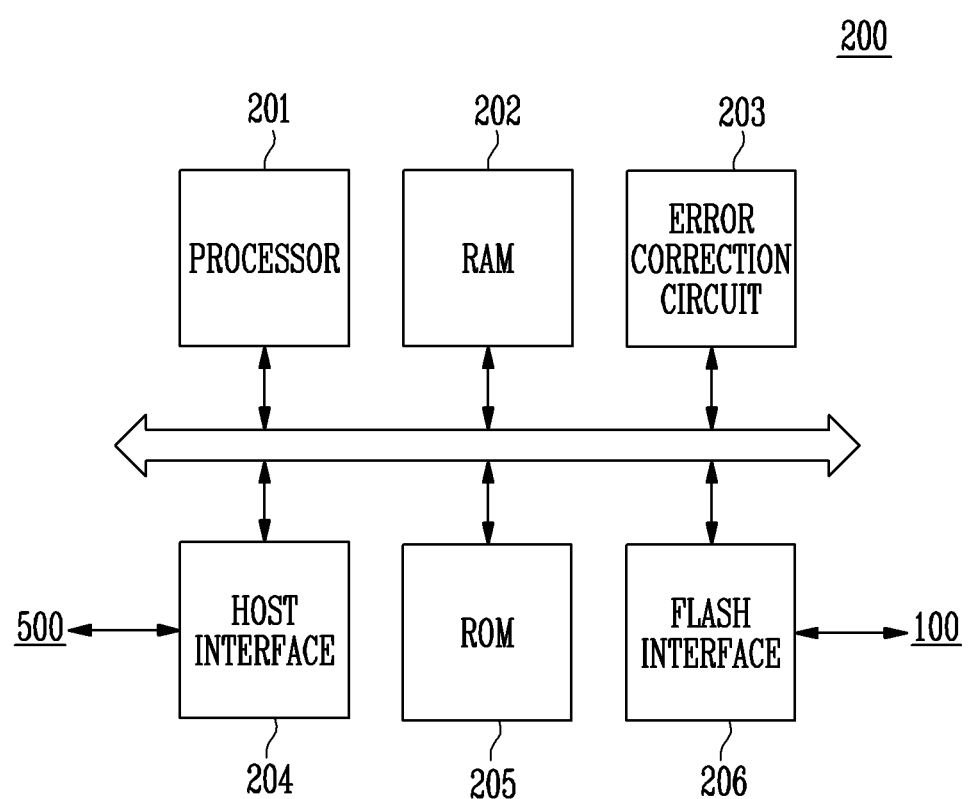
FIG. 9 is a diagram illustrating a memory controller according to an embodiment of the present disclosure.

FIG. 9 is a diagram illustrating a memory controller according to an embodiment of the present disclosure.

Referring to FIG. 9, the memory controller 200 may include a processor 201, a RAM 202, an error correction circuit 203, a host interface 204, a ROM 205, and a flash interface 206.

The processor 201 may control an overall operation of the memory controller 200.

The RAM 202 may be used as a buffer memory, a cache memory, an operation memory, and the like of the memory controller 200. For example, the RAM 202 may be a buffer memory.

The error correction circuit 203 may generate an error correction code (ECC) for correcting a fail bit or an error bit of data received from the memory device 100.

The error correction circuit 203 may perform error correction encoding of data provided to the memory device 100 to generate data to which a parity bit is added. The parity bit (not shown) may be stored in the memory device 100.

The error correction circuit 203 may perform error correction decoding on the data output from the memory device 100, and at this time, the error correction circuit 203 may correct an error using parity.

For example, the error correction circuit 203 may correct the error using various coded modulations such as an LDPC code, a BCH code, a turbo code, a Reed-Solomon code, a convolution code, an RSC, a TCM, and a BCM.

The error correction circuit 203 may calculate an error correction code value of data to be programmed to the memory device 100 in the program operation.

The error correction circuit 203 may perform an error correction operation based on the error correction code value on data read from the memory device 100 in the read operation.

The error correction circuit 203 may perform an error correction operation of data recovered from the memory device 100 in a recovery operation of failed data.

The memory controller 200 may communicate with an external device (for example, the host 500, an application processor, and the like) through the host interface 204.

The ROM 205 may store various pieces of information required to operate the memory controller 200 in a firmware form.

The memory controller 200 may communicate with the memory device 100 through the flash interface 206. The memory controller 200 may transmit the command CMD, the address ADDR, a control signal CTRL, and the like to the memory device 100 and receive data through the flash interface 206.

For example, the flash interface 206 may include a NAND interface.

Figure 10:
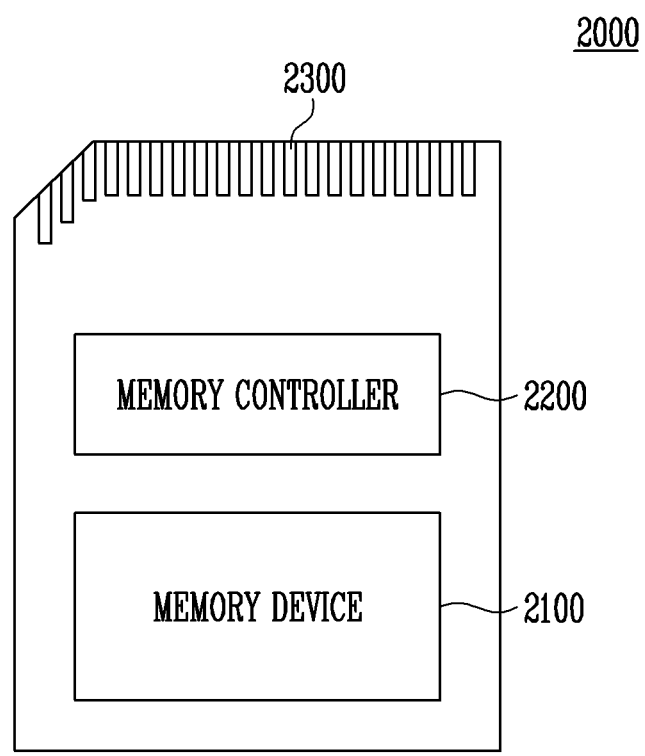
FIG. 10 is a block diagram illustrating a memory card system to which a storage device according to an embodiment of the present disclosure is applied.

FIG. 10 is a block diagram illustrating a memory card system to which a storage device according to an embodiment of the present disclosure is applied.

Referring to FIG. 10, the memory card system 2000 includes a memory device 2100, a memory controller 2200, and a connector 2300.

For example, the memory device 2100 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetoresistive RAM (STT-MRAM).

The memory controller 2200 is connected to the memory device 2100. The memory controller 2200 is configured to access the memory device 2100. For example, the memory controller 2200 may be configured to control read, write, erase, and background operations of the memory device 2100. The memory controller 2200 is configured to provide an interface between the memory device 2100 and the host 500. The memory controller 2200 is configured to drive firmware for controlling the memory device 2100. The memory controller 2200 may be implemented identically to the memory controller 200 described with reference to FIG. 1.

For example, the memory controller 2200 may include components such as a random access memory (RAM), a processor, a host interface, a memory interface, and an error correction circuit.

The memory controller 2200 may communicate with an external device through the connector 2300. The memory controller 2200 may communicate with an external device (for example, the host 500) according to a specific communication standard. For example, the memory controller 2200 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

The memory device 2100 and the memory controller 2200 may be integrated into one semiconductor device to configure a memory card. For example, the memory controller 2200 and the memory device 2100 may be integrated into one semiconductor device to configure a memory card such as a PC card (personal computer memory card international association (PCMCIA)), a compact flash card, a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 11:
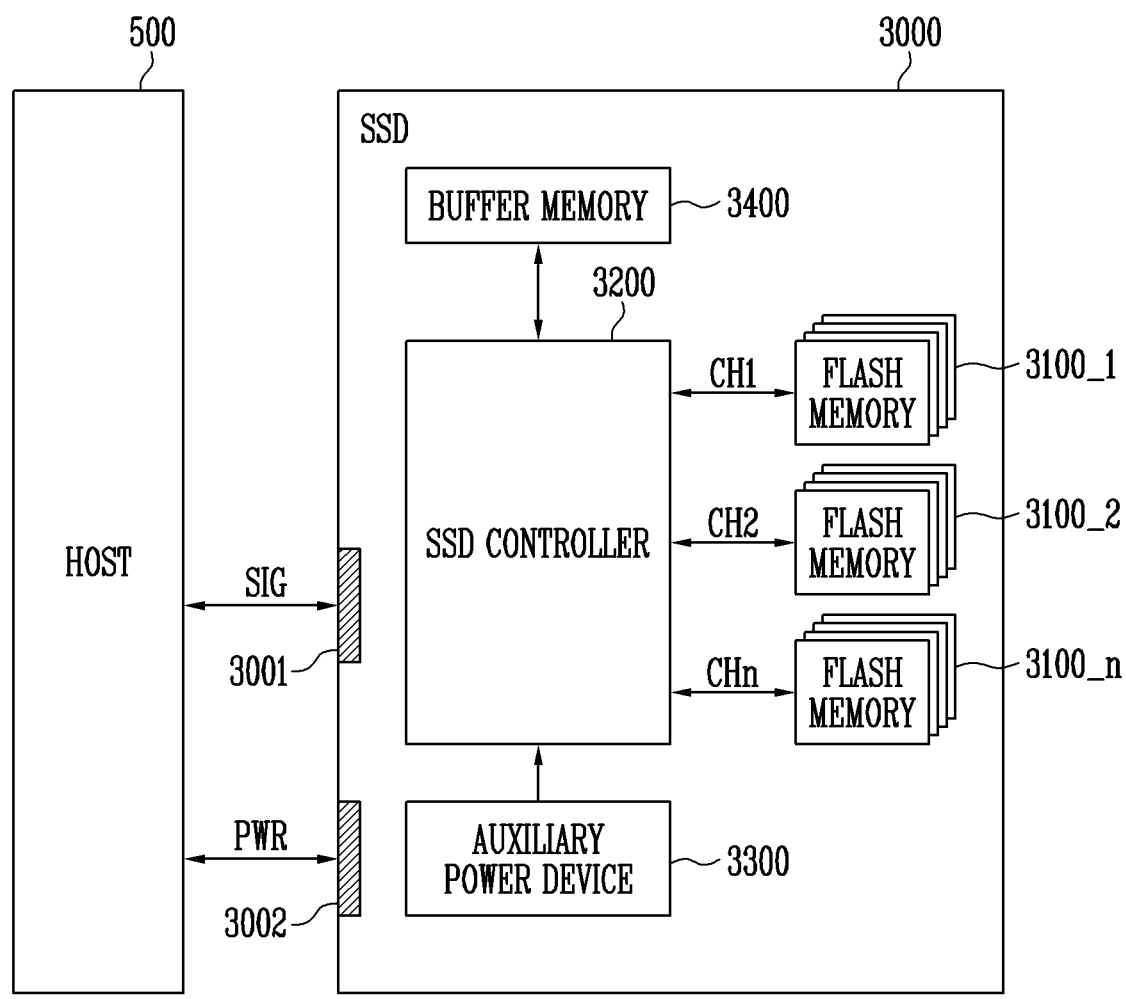
FIG. 11 is a block diagram illustrating a solid state drive (SSD) system to which a storage device according to an embodiment of the present disclosure is applied.

FIG. 11 is a block diagram illustrating a solid state drive (SSD) system to which a storage device according to an embodiment of the present disclosure is applied.

Referring to FIG. 11, the SSD system includes the host 500 and an SSD 3000.

The SSD 3000 exchanges a signal SIG with the host 500 through a signal connector 3001 and receives power PWR through a power connector 3002. The SSD 3000 includes an SSD controller 3200, a plurality of flash memories 3100_1, 3100_2, and 3100_n, an auxiliary power device 3300, and a buffer memory 3400.

According to an embodiment of the present disclosure, the SSD controller 3200 may perform the function of the memory controller 200 described with reference to FIG. 1.

The SSD controller 3200 may control the plurality of flash memories 3100_1, 3100_2, and 3100_n in response to the signal SIG received from the host 500. For example, the signal SIG may be signals based on an interface between the host 500 and the SSD 3000. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3300 is connected to the host 500 through the power connector 3002. The auxiliary power device 3300 may receive the power PWR from the host 500 and may charge the power. The auxiliary power device 3300 may provide power to the SSD 3000 when power supply from the host 500 is not smooth. For example, the auxiliary power device 3300 may be positioned in the SSD 3000 or may be positioned outside the SSD 3000. For example, the auxiliary power device 3300 may be positioned on a main board and may provide auxiliary power to the SSD 3000.

The buffer memory 3400 may temporarily store data. For example, the buffer memory 3400 may temporarily store data received from the host 500 or data received from the plurality of flash memories 3100_1, 3100_2, and 3100_n, or may temporarily store meta data (for example, a mapping table) of the flash memories 3100_1, 3100_2, and 3100_n. The buffer memory 3400 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 12:
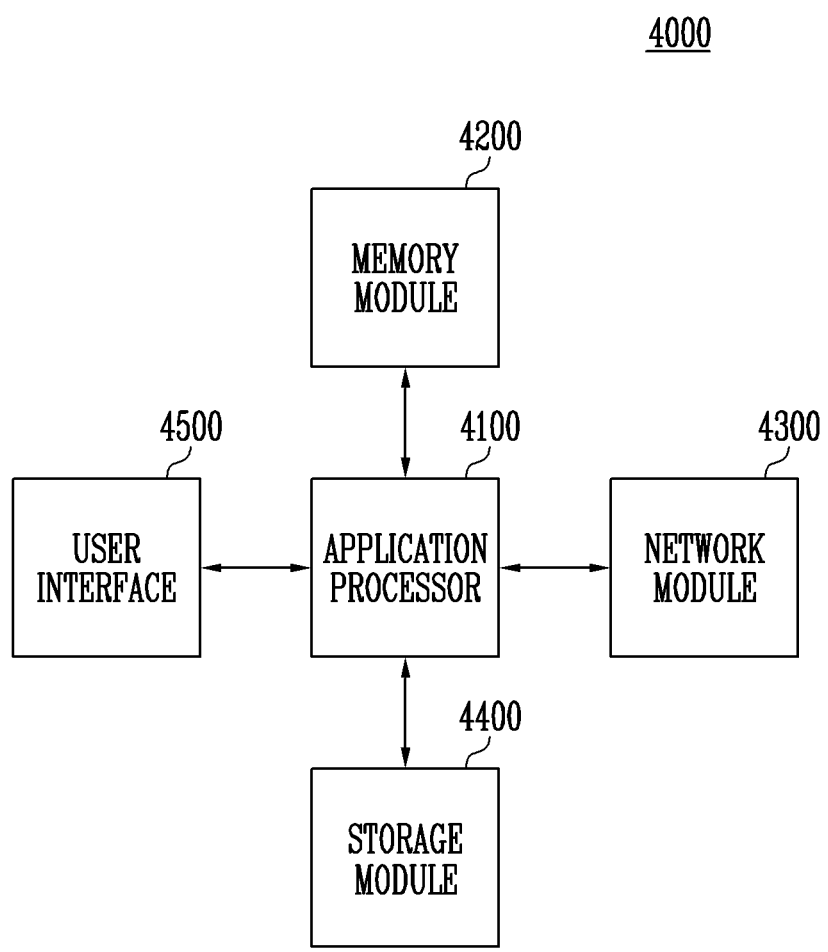
FIG. 12 is a block diagram illustrating a user system to which a storage device according to an embodiment of the present disclosure is applied.

FIG. 12 is a block diagram illustrating a user system to which a storage device according to an embodiment of the present disclosure is applied.

Referring to FIG. 12, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may operate identically to the storage device 1000 described with reference to FIG. 8. The storage module 4400 may include a plurality of nonvolatile memory devices, and the plurality of nonvolatile memory devices may operate identically to the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While certain embodiments have been described above, it will be understood to those skilled in the art that the embodiments described are by way of example only. Accordingly, the memory system should not be limited based on the described embodiments. Rather, the memory system described herein should only be limited in light of the claims that follow when taken in conjunction with the above description and accompanying drawings.

What is claimed is:

1. A memory device that outputs read data in response to a read enable signal provided from a memory controller, the memory device comprising:
   a plurality of memory cells configured to store data;
   a plurality of page buffers configured to sense the data stored in the plurality of memory cells through a plurality of bit lines; and
   a data output controller configured to:
   select a target page buffer to output data from among the plurality of page buffers according to a page buffer address control signal provided from the memory controller, and
   control the selected target page buffer to output data stored in the selected target page buffer according to the read enable signal, while the read enable signal is input,
   wherein the page buffer address control signal indicates whether an available storage capacity exists in a storage space allocated to the memory controller.

2. The memory device of claim 1, wherein the data output controller sequentially selects the target page buffer from among the plurality of page buffers according to an address of a page buffer during a period in which a voltage level of the page buffer address control signal is a first voltage level, and maintains the target page buffer during a period in which the voltage level of the page buffer address control signal is a second voltage level different from the first voltage level.

3. The memory device of claim 2, wherein the data output controller maintains, as the target page buffer, a page buffer that outputs data before the voltage level of the page buffer address control signal is changed from the first voltage level to the second voltage level among the plurality of page buffers.

4. The memory device of claim 3, wherein the page buffer address control signal is a signal having the first voltage level or the second voltage level according to whether the available storage capacity exists in the storage space allocated to the memory controller.

5. The memory device of claim 4, wherein the page buffer address control signal has the first voltage level when the available storage capacity exists and has the second voltage level when a storage capacity of the storage space is full.

6. The memory device of claim 1, wherein the read enable signal is a clock signal toggled while the page buffer address control signal is provided.

7. A storage device comprising:
   a memory device including an input/output port, a read enable port, and a page buffer address port; and
   a memory controller configured to:
   provide a read enable signal to the read enable port in response to a read request provided from a host,
   receive read data from the input/output port according to the read enable signal,
   temporarily store the read data received from the input/output port in a pre-allocated storage space,
   provide the page buffer address port with a page buffer address control signal for controlling an output of input/output port according to whether an available storage capacity exists in the storage space, and
   provide the host with the read data temporarily stored in the storage space in response to completion of read operation of the memory device,
   wherein the memory device outputs subsequent read data based on the page buffer address control signal next to outputting the read data.

8. The storage device of claim 7,
   wherein the memory controller provides the page buffer address control signal having a first voltage level when the available storage capacity exists, and
   wherein the memory controller is further configured to receive the subsequent read data from the input/output port while the page buffer address control signal having the first voltage level is provided to the page buffer address port.

9. The storage device of claim 8,
   wherein the memory controller provides the page buffer address control signal having a second voltage level different from the first voltage level when a storage capacity of the storage space is full, and
   wherein the memory controller is further configured to receive previous read data from the input/output port while the page buffer address control signal having the second voltage level is provided to the page buffer address port.

10. The storage device of claim 9, wherein the previous read data is the read data output from the input/output port before a voltage level of the page buffer address control signal is changed from the first voltage level to the second voltage level.

11. The storage device of claim 10, wherein the memory controller is further configured to discard the previous read data provided from the input/output port while the page buffer address control signal having the second voltage level is provided to the page buffer address port.

12. The storage device of claim 10, wherein the memory controller is further configured to perform, when the storage capacity of the storage space is full, a data buffer flush operation of flushing the storage space to generate the available storage capacity.

13. The storage device of claim 7, wherein the memory controller comprises:
    a data buffer having the storage space; and
    an operation controller configured to:
    store the read data received from the input/output port in the data buffer,
    monitor whether the available storage capacity exists in a storage capacity of the data buffer, and
    change a voltage level of the page buffer address control signal to a second voltage level different from a first voltage level according to a monitor result.

14. The storage device of claim 13, wherein the operation controller is further configured to store the subsequent read data in the data buffer during a period in which the voltage level of the page buffer address control signal is the first voltage level.

15. The storage device of claim 13, wherein the operation controller receives, during a period in which the voltage level of the page buffer address control signal is the second voltage level, the read data output from the input/output port before the voltage level of the page buffer address control signal is changed from the first voltage level to the second voltage level.

16. The storage device of claim 7, wherein the read enable signal is a clock signal toggled while the page buffer address control signal is provided.

17. A method of operating a memory controller that controls a memory device to perform a read operation, the method comprising:
   providing the memory device with a read enable signal indicating a timing at which the memory device outputs read data;
   receiving the read data sequentially outputted from the memory device according to the read enable signal;
   outputting a page buffer address control signal according to a result of monitoring whether an available storage capacity exists in a data buffer; and
   temporarily storing the read data sequentially received from the memory device in the data buffer during a period in which a voltage level of the page buffer address control signal is a first voltage level.

18. The method of claim 17, wherein outputting the page buffer address control signal comprises:
   outputting the page buffer address control signal having the first voltage level in response to a result of monitoring that the available storage capacity exists; and
   outputting the page buffer address control signal having a second voltage level different from the first voltage level in response to a result of monitoring that a storage capacity of the data buffer is full.

19. The method of claim 18, further comprising discarding the read data received from the memory device while the voltage level of the page buffer address control signal is the second voltage level.

20. The method of claim 19, further comprising providing the read data stored in the data buffer to a host in response to completion of the read operation.

* * * * *